United States Patent [19]

Burnham et al.

[11] Patent Number: 4,694,459
[45] Date of Patent: Sep. 15, 1987

[54] HYBRID GAIN/INDEX GUIDED SEMICONDUCTOR LASERS AND ARRAY LASERS

[75] Inventors: Robert D. Burnham, Palo Alto; Thomas L. Paoli; Donald R. Scifres, both of Los Altos; William Streifer, Palo Alto, all of Calif.

[73] Assignee: Xerox Corporation, Stamford, Conn.

[21] Appl. No.: 739,805

[22] Filed: May 31, 1985

[51] Int. Cl.⁴ .............................................. H01S 3/19
[52] U.S. Cl. ........................................ 372/45; 372/46; 372/50
[58] Field of Search ......................... 372/45, 46, 48, 50

[56] References Cited

U.S. PATENT DOCUMENTS

| Re. 31,806 | 1/1985 | Scifres et al. | 372/46 |
|---|---|---|---|
| 4,190,809 | 2/1980 | Goodman et al. | 372/46 |
| 4,475,200 | 10/1984 | Lee | 372/46 |
| 4,509,173 | 4/1985 | Umeda et al. | 372/50 |
| 4,594,718 | 6/1986 | Scifres et al. | 372/46 |

*Primary Examiner*—James W. Davie
*Attorney, Agent, or Firm*—W. Douglas Carothers, Jr.

[57] ABSTRACT

A hybrid index/gain guided semiconductor laser has a gain guide type body with index waveguide attributes is characterized by having two regions of current confinement means. The first of these regions contains primary current confinement means and at least one second region which includes a pair of current confinement means parallel to each other and axially offset relative to the axis of the primary current confinement means and extend from the other laser facet toward the first region. The axially offset current confinement means in the second region provide regions of lower refractive index in the laser structure compared to the region of the laser optical cavity established between the offset current confinement means and, as a result, function as an index optical waveguide for the laser. The first region may be electrically isolated from the second region so that the first region is independently pumped relative to the second region. By varying the pumping current to the regions of the axially offset current confinement means, one can selectively change the refractive index differences established between the axially offset confinement means regions and the optical cavity region therebetween. The primary and offset current confinement geometry may be utilized in single or multiple element lasers.

31 Claims, 20 Drawing Figures

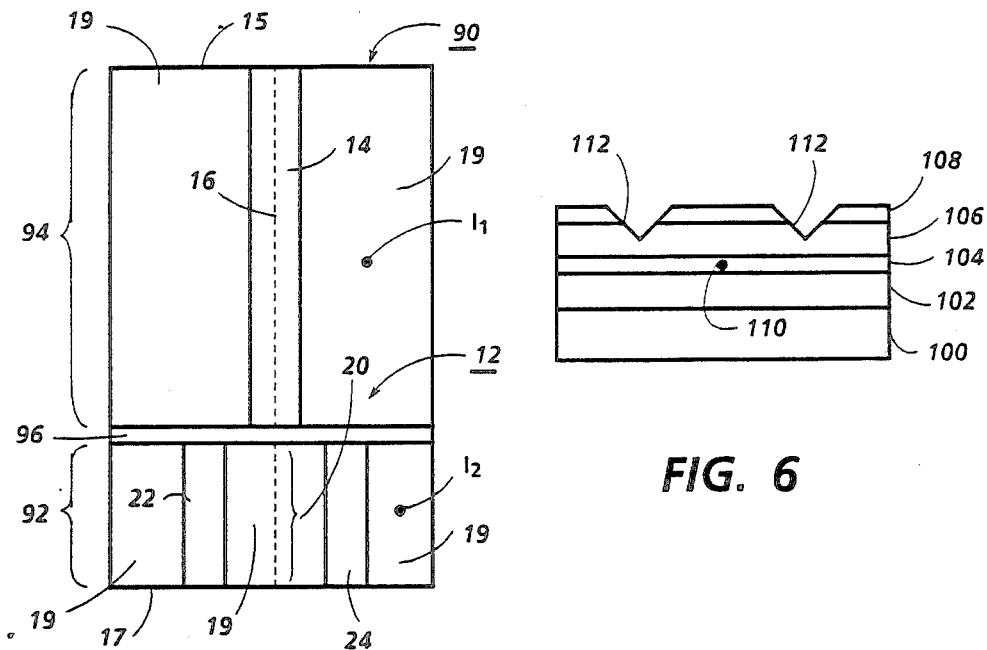
FIG. 5
FIG. 6
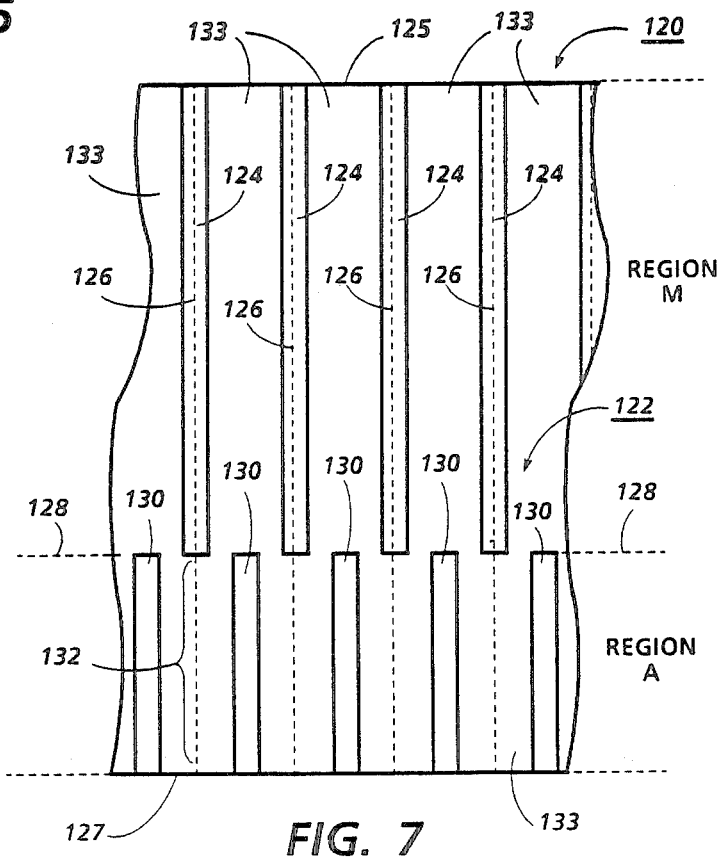
FIG. 7

HYBRID GAIN/INDEX GUIDED SEMICONDUCTOR LASERS AND ARRAY LASERS

BACKGROUND OF THE INVENTION

This invention relates to semiconductor heterostructure lasers and array lasers and in particular various types of stripe geometry for such lasers to achieve combination gain/index guiding properties.

It is known that a lateral change in refractive index can be produced in a semiconductor material or semiconductor device structures, e.g., a semiconductor laser, by injecting carriers into the material in selected regions of the material or structure. The injected region carriers can help create an optical waveguide in a semiconductor heterostructure laser, for example. Because the injected electrons in a current confinement region designed for laser pumping reduce the refractive index, this index reduction effect in the region of lasing is the exact opposite of what is desired. As a result, an anti-waveguiding effect may be produced in the central area of the current confinement region where the lowest refractive index is observed. As a result, single or fundamental mode operation may be difficult to achieve and higher order modes may prevail.

The above problems of anti-waveguiding may be overcome by employing a twin stripe arrangement as disclosed in Goodman et al U.S Pat. No. 4,190,809. The laser device of this patent provides for two spaced parallel current injection stripes which are sufficiently separated to produce a lateral carrier density distribution that dips in the central region midway between the stripes to create an improved optical guide in the dipped region due to slightly higher refractive index properties. With the incorporation of proper design parameters, an optical waveguide region can be formed that has proper guide properties selective of the zero order or fundamental transverse mode and single longitudinal mode. The design of the waveguide is critical so that adequate waveguiding for the zero order or fundamental mode is achieved which may be otherwise unfavored since the lateral gain distribution will be a minimum between the parallel stripes potentially capable of causing other higher modes to take advantage of the condition due to promotion of their initiation. By optimizing the spacing between the parallel stripes as well as the width of the double stripes, satisfactory operation has been reported for zero order or fundamental transverse mode and single longitudinal mode.

However, improved operation can be achieved to obtain index waveguiding in hybrid index/gain guided laser structures having zero order mode operation without needed precision and geometry disclosed in the double stripe laser of Goodman et al.

SUMMARY OF THE INVENTION

According to this invention, a hybrid index/gain guided semiconductor laser having a gain guide type body with index waveguide attributes is characterized by having two regions of current confinement means, the first of these regions containing primary current confinement means and at least one second region which includes a pair of current confinement means parallel to each other and axially offset relative to the axis of the primary current confinement means and extend from the other laser facet toward the first region. The axially offset current confinement means in the second region provides regions of lower refractive index in the laser structure compared to the region of the laser optical cavity established between the offset current confinement means functioning as an index optical waveguide for the laser.

The first region may be electrically isolated from the second region so that the first region is independently pumped relative to the second region. By varying the pumping current to the regions of the axially offset current confinement means, one can selectively change the refractive index differences established between the axially offset current confinement means regions and the optical cavity region therebetween.

The basic form of the present invention is similar in configuration to a "tuning fork" to effectively change the refractive index of the region of the auxiliary offset current confinement means relative to the laser optical cavity region thereby forming an index waveguide feature as well as regions of higher gain in these offset regions. Many other alternate geometric stripe configurations are possible as well as combinations among such configurations as will be evident from the description of preferred embodiments.

Also, the offset tuning fork geometry may be employed in phased array lasers or weakly coupled array lasers wherein structural current confinement means associated with the array laser is provided with portions outside of or offset from the multi optical cavities of the laser in regions between such cavities so that the refractive indices in the regions offset from the optical cavities are made lower compared to refractive indices of the optical cavities to form an index waveguide in the gain guided array laser structure. Also, an accompanying result is that the amount of gain experienced in the offset regions is enhanced compared to the gain experienced in the optical cavities in the regions between the offset regions. The lateral gain density distribution across the array laser outside of the optical cavities in the inbetween regions will be higher than the gain experienced in the optical cavities, so that, if the laser cavities are phased locked, the lateral modulated gain distribution will favor fundamental supermode over other potential higher supermodes of the array laser.

A hybrid index/gain guided array semiconductor laser may also have their first region electrically isolated from the second region so that the first region is independently pumped relative to the second region. By varying the pumping current to the axially offset current confinement means regions, one can selectively change the refractive index differences between the regions of the axially offset current confinement means and the optical cavity regions therebetween.

The hybrid index/gain guided array semiconductor lasers herein may be weakly coupled, i.e., their optical cavities are sufficiently spaced apart as not to have strong optical coupling between neighboring optical lasing filaments, or they may be phased locked due to the lasing elements being sufficiently close to each other so that the evanescent wave of each optical cavity overlaps into adjacent optical cavities. Also, any previously known architecture may be utilized to provide direct coupling for establishing a phase lock condition. One such example is illustrated in U.S. Pat. No. Re. 31,806.

In all these hybrid index/gain guided semiconductor laser structures, the primary current confinement means in the first region may extend to the second region or fall short of the second region. By the same token, the offset current confinement means in the first region may extend to the first region or fall short of the first region. Also, the offset current confinement means second region may be provided at both ends of the first region.

The implementation of the tuning fork concept can be further enhanced by (1) employing quantum well structure in the active region of the laser, and (2) selectively increasing the facet mirror reflectivity between primary pumping stripes while reducing the facet minor reflectivity in other facet regions.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 5 is another diagrammatic plan view of the fundamental geometric stripe configuration shown in FIG. 1 except that separate contact regions are formed for the offset stripe region and for the primary current pumping stripe region.

FIG. 6 is a front end view of the lasers shown in FIGS. 1-5 demonstrating the use of V-grooves for enhanced current confinement profiles in the offset stripe regions.

FIG. 7 is a partial diagrammatic plan view of the fundamental geometric stripe configuration of FIG. 1 as applied to a multicavity array laser.

DETAILED DESCRIPTION OF THE PREFERRED EMBODIMENTS

Figure 1:
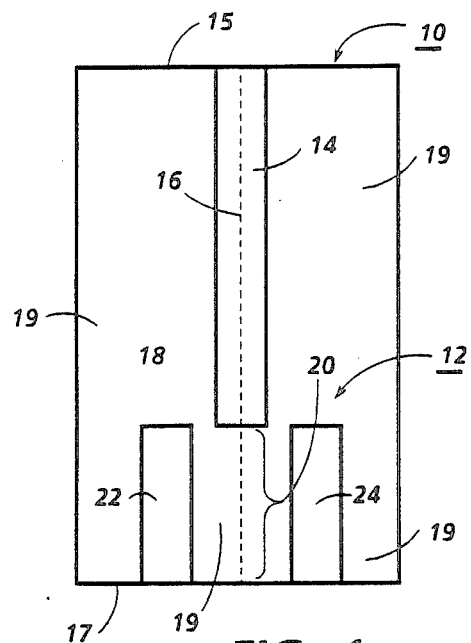
FIG. 1 is a diagrammatic plan view of the fundamental geometric stripe configuration comprising this invention.

Reference is now made to FIG. 1 wherein there is illustrated the fundamental geometric stripe configuration comprising this invention. The gain guided semiconductor laser 10 may be of conventional design well known in the art, e.g., the heterostructure GaAs/GaAlAs regime with planar layers. The laser structure may incorporate a single or multiple quantum well as the active region, which is preferred, although zero order or fundamental mode operation may still be achieved for a single active layer having a thickness greater than that required to produce a quantum size effect, e.g., 400 Å-600 Å thickness range. The foregoing equally applies to the other geometric stripe configurations to be hereinafter described.

Laser 10 has a stripe configuration 12 comprising a main current confinement means in the form of confining pumping stripe 14 that extends from one end facet 15 for a substantial extent of the laser length. Beneath stripe 14 is the established optical cavity of laser 10, represented by dotted line 16, which cavity includes the active region of the laser and is approximate to the laser p-n junction when the laser is forward biased via stripe 14. Carrier injection and recombination occurs in the active layer in the region of the optical cavity supporting radiation propagation under lasing conditions in the optical cavity between end facets 15 and 17.

At the point 18 of stripe termination there is a region 20 where there is no sustained current pumping into the optical cavity. However, there is provided auxiliary current confinement means in the form of a pair of spaced stripes 22 and 24 that are in regions outside or offset from cavity 16 that are pumped simultaneously with primary stripe 14. The regions of laser 10 below offset stripes 22 and 24 also have current flow established to the bottom contact of the laser so that these regions represented by stripes 22 and 24 establish regions of lower refractive index but of higher gain. In region 20 in optical cavity 16, there is a lower concentration of carrier injection compared to offset regions 22 and 24. Also, local gain will also be higher in regions 22 and 24. The region on highest refractive index will be in region 20 where the carrier profile is at its lowest compared to offset regions 22 and 24 and as a result, the optimized index in region 20 of laser cavity 16 will favor zero order mode operation on the propagating radiation. The combination of the main primary pumping stripe and the offset pair of stripes 22 and 24 have been referred to by us as a "tuning fork" configuration, since the configuration has the appearance of a tuning fork and functions to "tune" the laser to zero order mode operation.

In effect, then, a conventional planar gain guided laser structure (i.e., without offset stripe regions 22 and 24) is literally converted into an index guided laser structure in region 20, with the inclusion of offset stripe regions 22 and 24, which is selective of the longitudinal and transverse mode and without astigmatism generally present in gain guided laser structures.

Primary pumping stripe 14 and offset stripes 22 and 24 may be formed in a number of different ways as is known in the art. For example, these stripes may be formed by selective etching through an oxide insulating layer 19 covering the entire surface of the laser cap or contact layer. On the other hand, region 19 may be the cap layer per se with the stripes 14, 22 and 24 being delineated by a proton bombardment or ion implantation with oxygen, for example, in all regions 19. Also, optimized current flow into the regions 22 and 24 may be achieved by making these regions more or less conductive compared to primary stripe region 14 by performing a selective diffusion, e.g., zinc, or by providing an ion implantation, e.g., Ge, into the stripe regions 22 and 24. This treatment will make these regions more conductive inducing a sharper current flow through the laser structure to the bottom metal contact of the laser. The manner of stripe geometric delineation described is also applicable to each of the other embodiments to be described. Once stripe delineation has been achieved, a metalization may be then applied to the surface of the laser to provide one of the electrical contacts for the laser structure. For purposes of clarity, no metalization has been shown in the drawings in order to reveal the stripe geometry.

Figure 17:
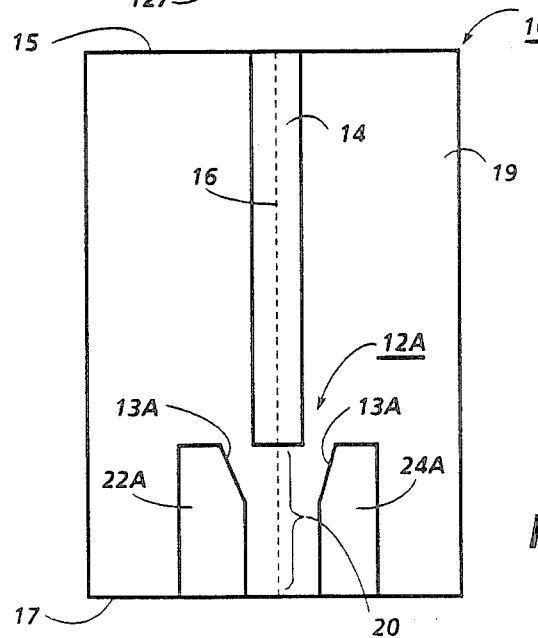
FIGS. 17-20 are diagrammatic plan views of other examples of geometric stripe configurations based upon the configuration of FIG. 1 to provide for better coupling between the primary current pumping stripe region and the offset stripe region and to optimize the profile of the propagating optical wave at one or both emitting facets of the laser.
Figure 18:
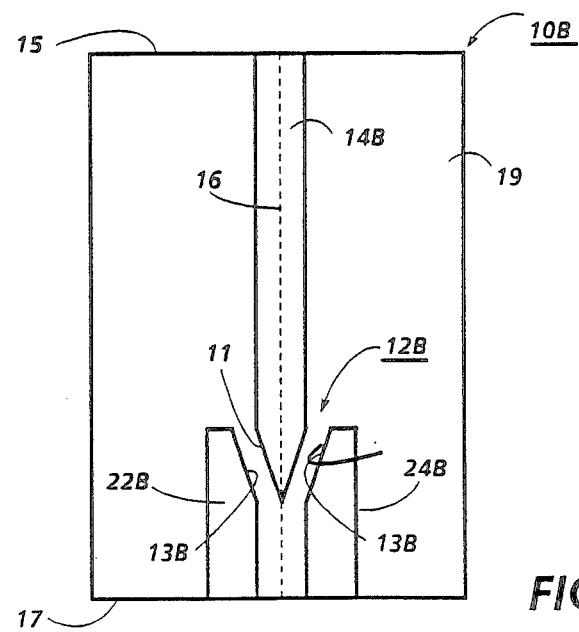

FIGS. 17–20 disclose varations of the geometry of stripes 22 and 24 to provide for better coupling between the primary current pumping stripe region and the offset stripe region and to optimize the profile of the propagating optical wave at one or both emitting facets of the laser. In FIG. 17, geometry 12A includes offset stripes 22A and 24A which have a wedged shaped portion 13A. In FIG. 18, geometry 12B includes offset stripes 22B and 24B with a wedged shaped portion 13B aligned with the spear point tip 11B of primary pumping strip 14B. These geometries provide for a gradual application of the index/gain change effects on the propagating light in optical cavity 16.

Figure 19:
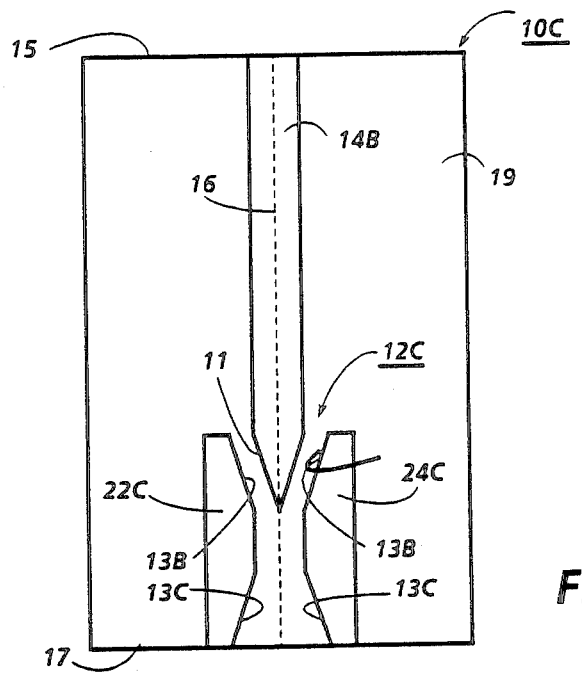
Figure 20:
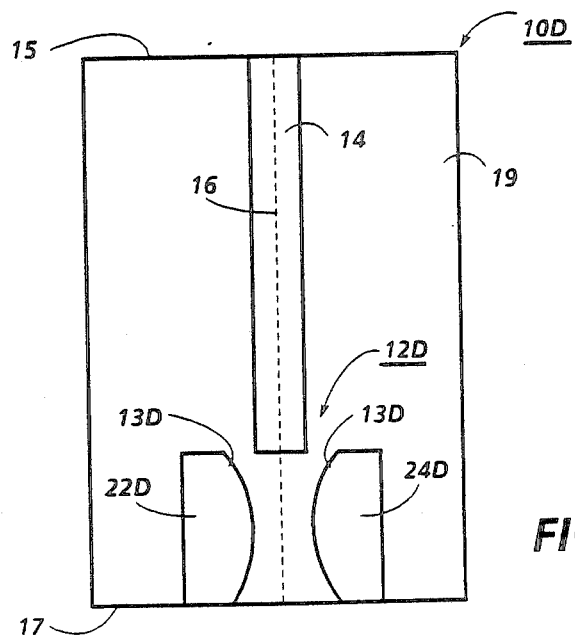

In FIG. 19, geometry 12C is identical to that shown in FIG. 18 except that offset stripes 22C and 24C also have a wedged shaped portion 13C at their other ends adjacent facet 17. In FIG. 18, geometry 12D includes offset stripes 22D and 24D that have arcuate portions 13D. These two geometry configurations provide for a gradual application of the index/gain change effects on the propagating light in optical cavity 16 as well as provide for spreading the light at facet 17. In this manner, the profile of the propagating light and the size of the emitting aperture can be predetermined by the angularity or curvature of respective portions 13C and 13D relative to facet 17.

The offset stripe geometry of FIGS. 17–20 may be applied at both ends of each of the laser structures shown.

Figure 2:
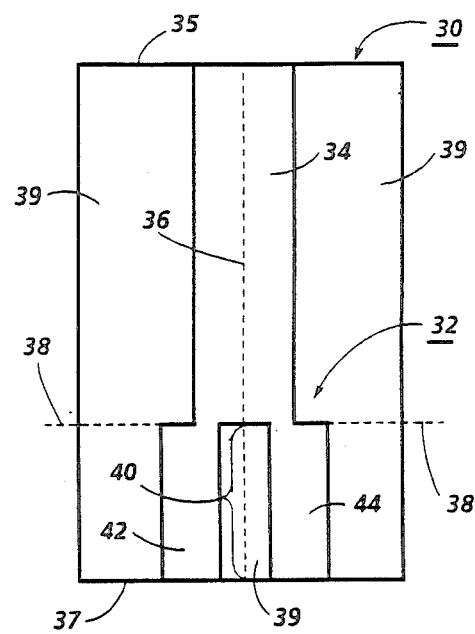
FIG. 2-4 are diagrammatic plan views of other examples of geometric stripe configurations comprising this invention.
Figure 3:
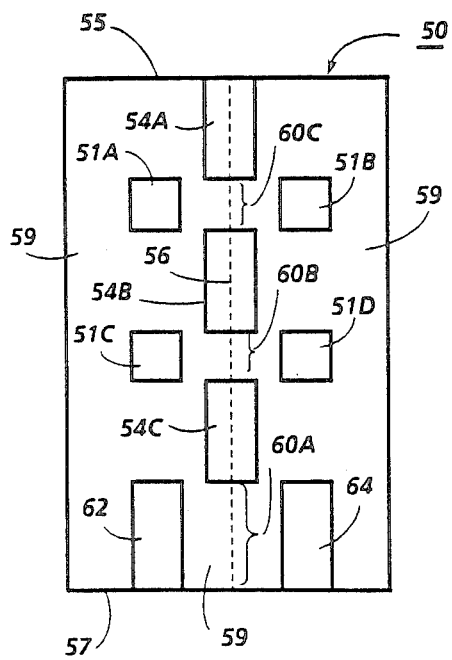
Figure 4:
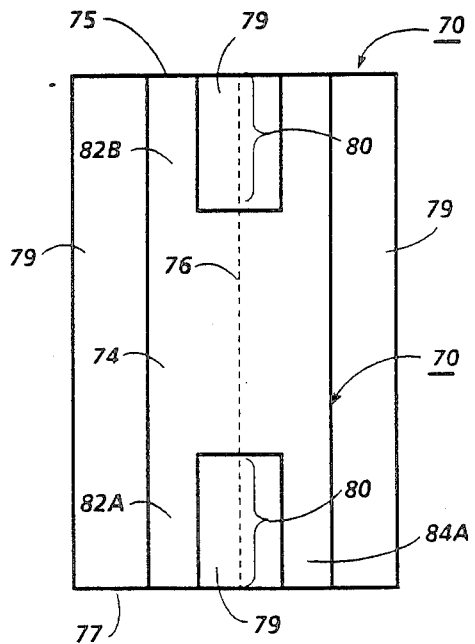

FIGS. 2–4 disclose other plan views of geometric stripe configurations which are presented to illustrate the multitude of other possible configurations that may incorporate the fundamentals of this invention. In FIG. 2, gain guided semiconductor laser 30 has a stripe configuration 32 similar to that shown in FIG. 1 except that the offset stripe configuration is joined to the primary pumping stripe. The primary pumping stripe 34 extends from end facet 35 to a point 38 where it is coupled at its corners to an adjacent corner of each offset stripe 42 and 44 which are offset but parallel to stripe 34 and extend to end facet 37. Regions 39 are insulative or of low conductivity so that current pumping is accomplished through the delineated regions of stripes 34, 42 and 44. The effect produced in region 40 between offset stripes 42 and 44 is the same as that in FIG. 1. The gain is higher in regions 42 and 44 while the effective refractive index in pumped regions below offset stripes 42 and 44 is lower so that the difference in refractive index forms an index waveguide region 40 which is conducive to preference for the zero or single order transverse and longitudinal mode operation.

In FIG. 3, short active pumping regions 54A, 54B and 54C are established for the primary pumping stripe geometry of hybrid index/gain guided laser 50. Offset and adjacent to stripes 54 and outside of optical cavity 56 are short offset stripes 51A, 51B, 51C and 51D. These short offset stripes together with longer offset stripes 62 and 64, which are the same configuration as stripes 22 and 24 in FIG. 1, influence the refractive index so that regions 60A, 60B and 60C form regions of higher indices that promote the selection and propagation of the single order mode.

Hybrid index/gain guided laser 70 in FIG. 4 has a stripe configuration 72 that comprises wide primary pumping stripe 74 which is bifurcated at each end to form pairs of offset stripes 82A; 84A and 82B; 84B, respectively terminating at facets 77 and 75. Configuration 72 is, therefore, similar to configuration 32 in FIG. 2 except for the double bifurcation and the extension of primary stripe 74 into the full width of offset stripes 82A; 84A and 82B; 84B. While the wider primary stripe configuration may provide for increased output power, the large width influences the introduction of other higher order modes. However, the bifurated offset stripes form the unpumped regions 80 which are effective to single out as a preference the single order mode which is fedback via facets 75 and 77 back into optical cavity 76.

Hybrid index/gain guided laser 90 in FIG. 5 has the same geometric stripe configuration 12 of FIG. 1 so that identical components of the configuration have identical reference numerals in FIG. 5. However, section 92 of laser 90 containing the offset stripes 22 and 24 is electrically isolated from section 94 containing the primary pumping stripe 94 by means of an electrically isolating region 96 formed between these sections. For purposes of clarity, no metal contacts are shown covering the separated sections 92 and 94. Sections 92 and 94 are pumped independently. Section 94 via stripe 12 may be pumped at one current magnitude, $I_1$, while section 92 via stripes 22 and 24 may be pumped at another current magnitude $I_2$. In this manner, changes in the effective refractive index between regions 22 and 24 and region 20 within cavity 16 can be readily made to "tune", i.e., selectively change the refractive index differences relative to the laser optical cavity by varying the magnitude of $I_2$ to foster and maintain single order mode operation.

Figure 14:
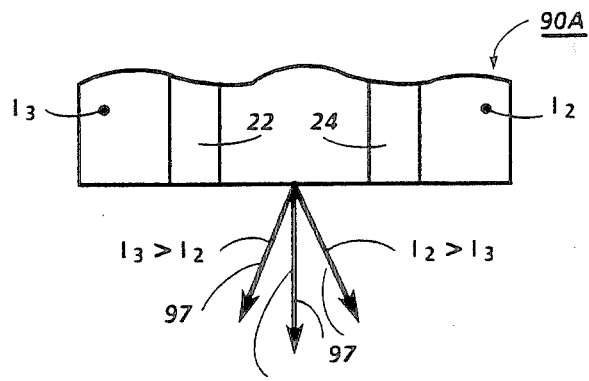
FIG. 14 is a partial end view of the laser shown in FIG. 13 illustrating its scanning capability by varying the current supplied to the electrically separate offset stripe regions.
Figure 13:
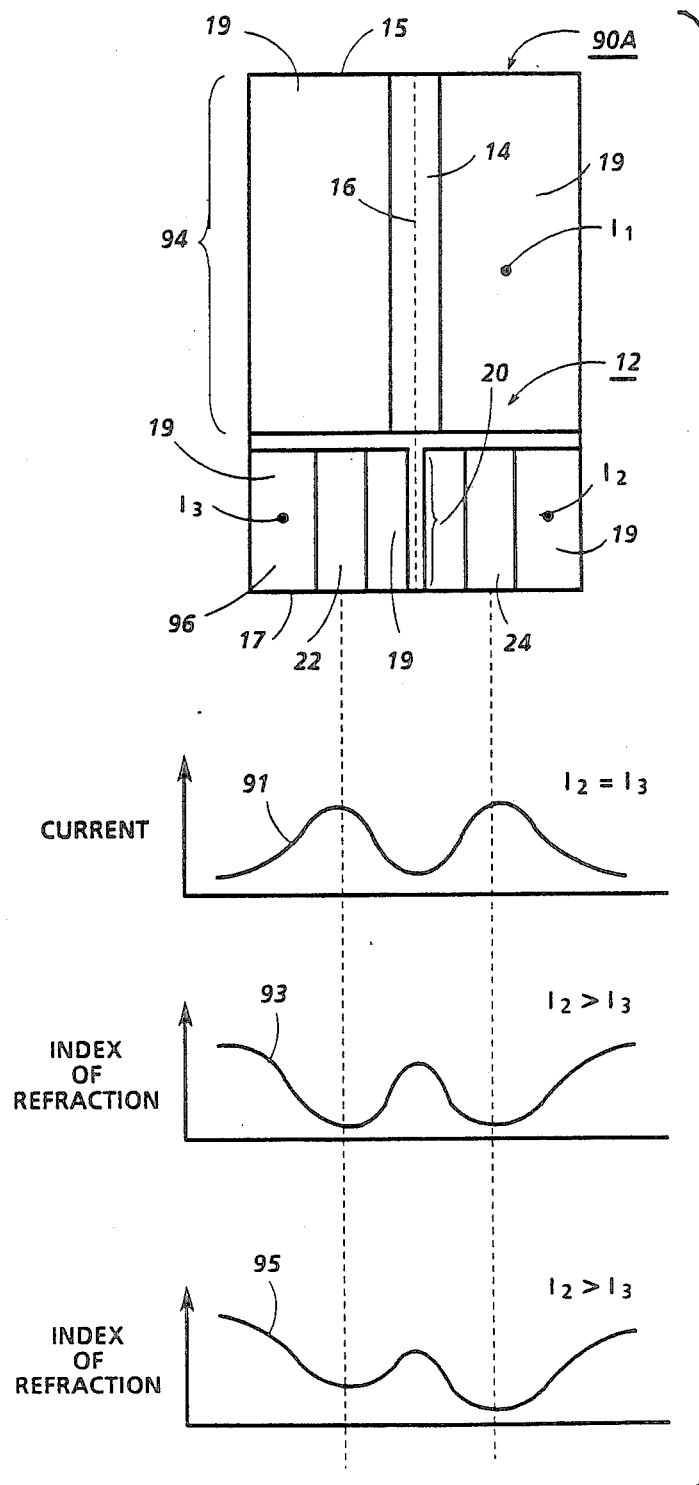
FIG. 13 is a diagrammatic plan view of the fundamental geometric stripe configuration shown in FIG. 1 except that separate contact regions are formed for the two offset stripes and for the primary current pumping stripe region. Also illustrated, in aligned fashion, are graphic illustrations of current distrubution and index of refraction laterally across the laser for different applied currents to the electrically separate offset stripe regions.

A modified form of laser 90 is shown in FIG. 13. Laser 90A is identical to laser 90 except that the offset stripe region of laser 90A is electrically isolated into two regions 92 and 96, which regions are also electrically isolated from primary current pumping stripe region 94. One offset stripe 24 is within pumped region 92 while the offset stripe 22 is within pumped region 96. Sections 92, 94 and 96 may be independently pumped respectively with current $I_2$, $I_1$ and $I_3$. If for example, $I_2$ is equal to $I_3$, the current distribution laterally across regions 92 and 96 will take the form of curve 91 in FIG. 13. The lateral distribution of the index of refraction will appear as curve 93 in FIG. 13 which curve is in a sense a compliment to curve 91. If, the magnitude of the current to region 92 is greater than the magnitude of the current to region 96, i.e., $I_2 > I_3$, the index of refraction will appear as curve 95 in FIG. 13. It can be seen, therefore, that by varying the difference in magnitude of $I_2$ and $I_3$, the beam 97 emitted from the cavity 16 of laser 90A may be angularly varied as illustrated in FIG. 14. Thus, by continuously varying the magnitude $I_2$ relative to $I_3$, the output beam 97 of laser 90A may be angularly scanned onto an image plane.

FIG. 6 is a side elevation of any one of the previously disclosed hybrid index/gain guided laser structures. The laser may comprise, for example, an n-GaAs substrate 100, a cladding layer 102 of n-$Ga_{1-x}Al_xAs$, an active layer 104 comprising a single or multiple quantum well structure of p or n alternating GaAs and AlAs layers or p or n alternating GaAs and $Ga_{1-y}Al_yAs$ layers where y is comparatively low, a cladding layer 106 of p-$Ga_{1-z}Al_zAs$ and cap layer 108 of p+- GaAs where z, x>y. The point of radiation emission 110 also represents the laser optical cavity. V-grooves 112 are provided as current confinement regions for the pair offset stripe configuration. Grooves 110 extend into the upper cladding layer 106 just above active region 104. The V-grooves provide for sharper current profiles to the desired regions of the active region offset optical cavity 110. The sharpness of the current profile can be further enhanced by providing a selective diffusion or ion implant into these regions to the depth of active region 104.

It should be realized that the V-grooves 112 may be employed in any of the offset stripe geometries of any of the embodiments disclosed herein. Further, the width of the offset stripes may be made narrower or larger to change the index and gain effect or may be varied in width along their length in a zig zag manner or in a serpentine manner to modulate the index and gain effect.

FIGS. 7 through 13 illustrate the "tuning fork" concept of this invention as applied in array lasers. In FIG. 7, the fundamental concept of FIG. 1 is shown in multiple form to accommodate a plurality of spaced lasers with parallel cavities. Again, one or more regions of the hybrid index/gain guided array laser structures are provided with induced index waveguide attributes to be mode selective and operate without astigmatism found in gain guided array lasers.

Hybrid index/gain guided array semiconductor laser 120 comprises a stripe configuration 122 that includes primary current confinement means in the form of a plurality of spaced primary stripes 124 forming spatial optical cavities 126. Primary stripes 124 extend from end facet 125 to a point represented by dotted line 128 and is represented as the main pumping region M. At their stripe termination is the tuning fork region A and in region A are auxiliary current confinement means in the form of offset stripes 130 are positioned to be outside the axial alignment of optical cavities 126 and extend from end facet 127 to dotted line 128. As in the case of previous embodiments, the cavity regions 132 are not pumped while the adjacent offset stripe regions 130 are pumped so that the refractive index present in regions 132 will be higher than that present in regions 130, providing an index guiding mechanism for the radiation propagating along optical cavities 126. All of the stripes 124 and 130 are delineated from remaining regions 133 by using insulating oxide, or selective diffusion or ion implantation as previously explained and which is known in the art. This same delineation is also achieved in the same manner for subsequent embodiments to be described.

If optical cavities 126 are sufficiently close, the radiation pattern from one cavity will overlap into adjacent cavities so that the modal patterns will become phased locked and can exhibit any one of a number of modal patterns depending upon the number of lasers present. In most cases, more than one modal pattern will be exhibited which is not desirable for array laser utility. Phased array lasers have high utility due to their high power output. However, the power should be concentrated in a single lobe which is referred to as the first or fundamental supermode. Gain guided array lasers will have a tendency to exhibit other modes other than the fundamental mode due to the natural lateral modal gain profile which will favor higher order supermodes over the fundamental supermode. With the offset stripes 130 in region A of array laser 120, however, the gain profile will be modulated with higher modal gain being experienced in the regions below stripes 130 as compared to cavity regions 132, i.e., the amount of gain experienced in regions 130 between optical cavities 126 is enhanced compared to the gain experienced in the cavities. As a result, the array laser 120 will continuously operate in the preferred fundamental supermode because the gain of the fundamental supermode propagating will be higher in optical cavity region 132 as compared to other higher order supermodes that might be present in the same region 132.

Figure 15:
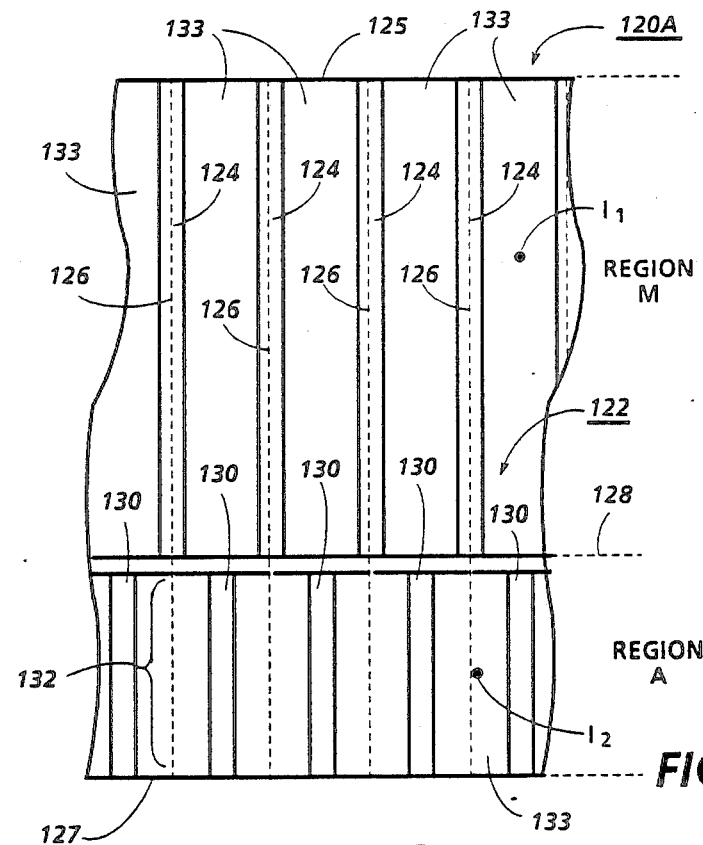
FIG. 15 is a partial diagrammatic plan view of the geometric multiple stripe configuration shown in FIG. 7 except that separate contact regions are formed for the offset stripe region and for the primary current pumping stripe region.

It should be noted that laser 120 may be modified to include a region A of offset stripes 130 positioned at the other end of laser 120 extending from end facet 125. Also, region A can be constructed as an electrically isolated region relative to region M as illustrated in the structure of array laser 120A of FIG. 15 so that regions M and A may be pumped with different current magnitudes $I_1$ and $I_2$. Thus, in the same manner as demonstrated in FIG. 5, changes in the effective refractive index between regions 130 and optical cavity regions 132 can be readily made by selectively varying the magnitude of $I_2$ to region A.

Figure 16:
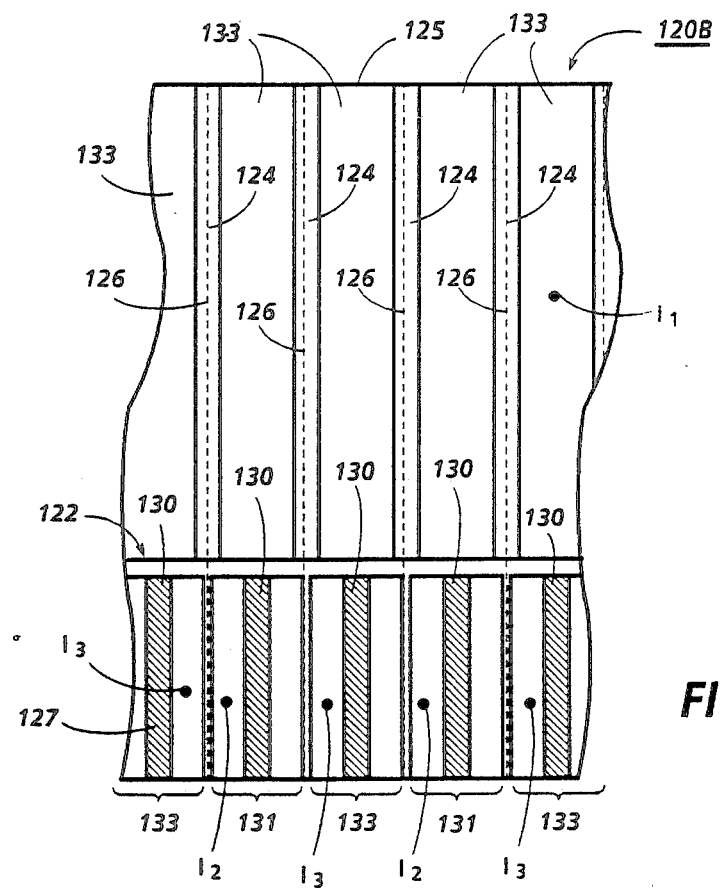
FIG. 16 is a partial diagrammatic plan view of the geometric multiple stripe configuration shown in FIG. 7 except that separate contact regions are formed for each of the offset stripes and for the primary current pumping stripe region.

Further, the regions of the individual offset stripes 130 may be independently electrically isolated from one another as well as isolated from primary current pumping region M. This is illustrated in FIG. 16. Array laser 120B is identical to laser 120A except that each offset stripe 130 are electrically isolated into separate alternate regions 131 and 133 and are alternately connected to current sources $I_2$ and $I_3$ as illustrated in FIG. 16. In this manner, the current supplied to alternate groups of regions 131 and 133 may be independently pumped by current sources $I_2$ and $I_3$. The array laser 120B will provide a broad output beam that may be scanned across an image plane by varying the magnitude of $I_2$ relative to the magnitude of $I_3$.

FIGS. 8-12 disclose other plan views of geometric stripe configurations for array lasers which are presented to illustrate the multitude of other possible configurations that may incorporate the fundamentals of this invention. As will be seen, a portion of each of these configurations can be used with portions of other configurations from other Figures to provide hybrid index/gain guided laser structures.

Figure 8:
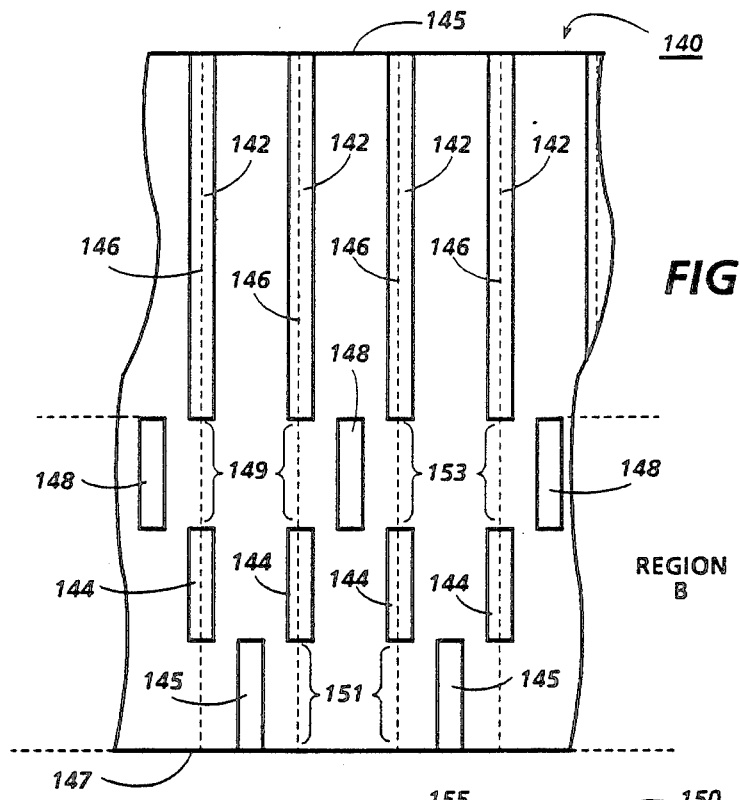
FIGS. 8-12 are partial diagrammatic plan views of other examples of geometric stripe configurations for multicavity array lasers.

In FIG. 8, array semiconductor laser 140 comprises a geometry 141 having a series of primary pumping stripes 142 extending from facet 145 but terminating short of facet 147. Stripes 142 establish optical cavities 146 and include a separate but axially aligned shorter pumping stripes 144, which are in region B of laser 140, Shorter pumping stripes 144 terminate short of end facet 147. In region B of laser 140, there are also offset stripes 148 formed in regions outside of cavities 146 in areas adjacent to the spaced ends of pumping stripes 142 and 144. Also, there are offset stripes 145 formed in regions outside of cavities 146 that extend from the opposite ends of pumping stripes 144 and terminate at end facet 147. Region B is a region of "staggered" offset stripe geometry that provides the attributes of this invention while also permiting the overlap coupling of light from one optical cavity 146 to an adjacent optical cavity 146 across the full width of the array via unpumped regions 149, 151 and 153.

Figure 9:
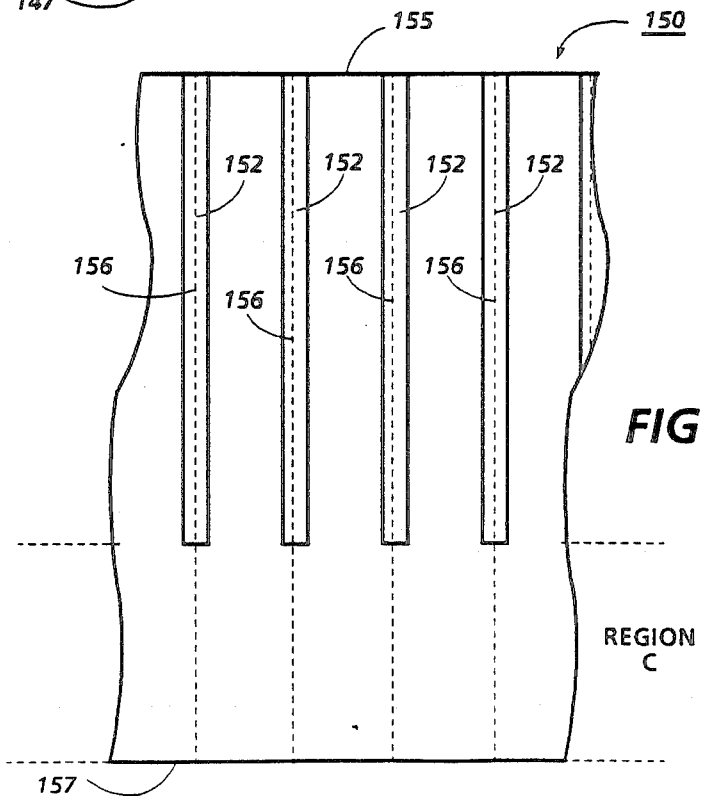

In FIG. 9, there is illustrated a phases lock array semiconductor laser comprising a plurality of spaced primary pumping stripes 152 extending from end facet 155 and establishing optical cavities 156. Stripes 152 terminate short of end facet 157 forming a region C wherein the propagating radiation may spread laterally into the laser medium since there is no influence of the current pumping stripes 152. Laser 150 does not incorporate the tuning fork concept of previous embodiments but is illustrated for the purpose of later discussion involving the interchange and combination of different regions making up an array laser structure.

Figure 10:
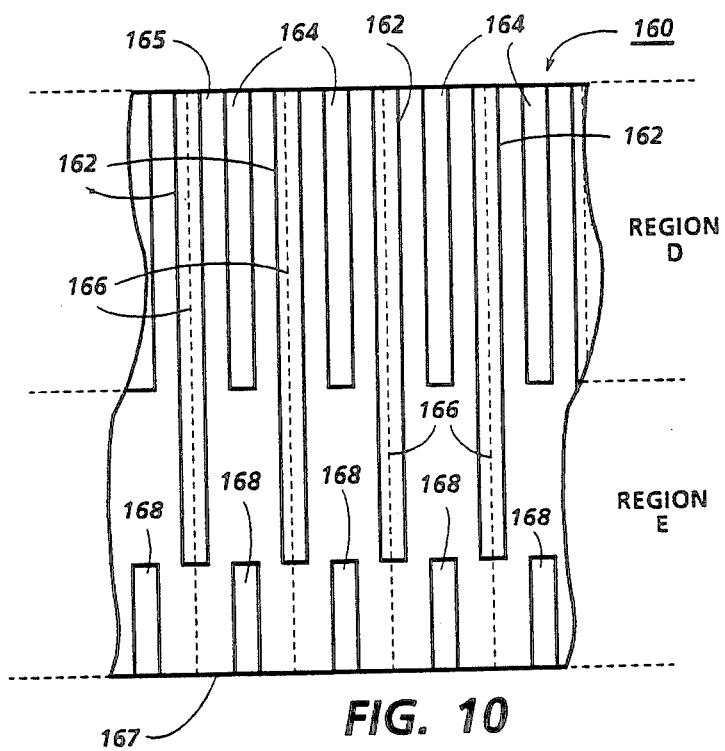

In FIG. 10, array semiconductor laser 160 comprises two sections, regions D and E. In region D, there are a plurality of aligned stripes, one set of stripes comprises primary pumping stripes 162 that extend from end facet 165 to region E. Also, in region D, primary stripes 162 are separated by shorter offset stripes 164. Offset stripes 164 may be V-grooved like those illustrated in FIG. 6. The optical cavities 166 of laser primary stripes 162 extend to end facet 167 in region E. The point of termination of laser primary stripes 162 in region E is the point of begining of offset stripes 168 which are aligned with offset stripes 164 and can be considered an interrupted continuation of offset stripes 164. Major offset stripes 164 may be fabricated to have higher conductivity and, therefore, permit greater current density compared to primary pumping stripes 162. In this manner, region D provides for improved modal coupling of adjacent laser cavities 166 while encouraging the supermode to propagate and couple into adjacent cavities to be that of the fundamental supermode with the aid of the index guiding feature of offset stripes 168 in region E.

Figure 11:
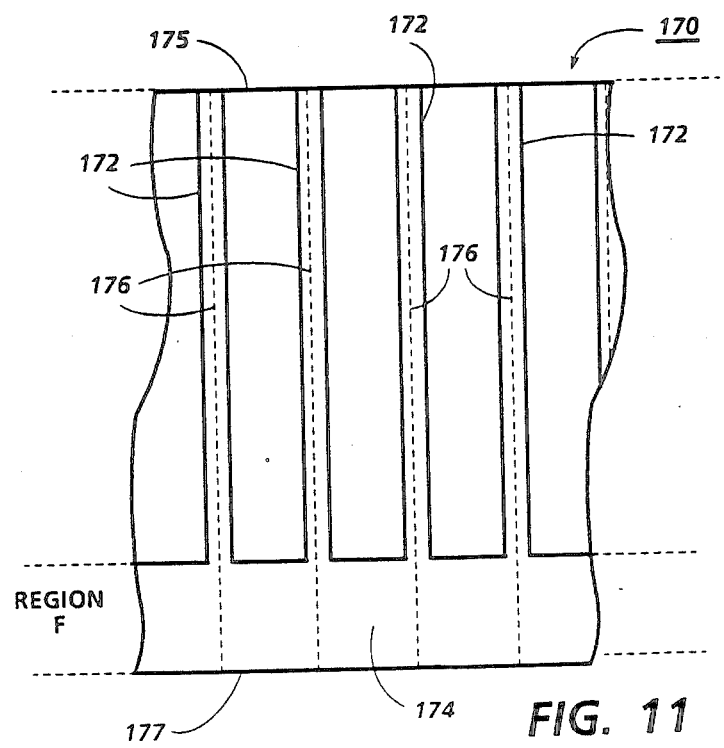

In FIG. 11, array semiconductor laser 170 comprises a series of primary pumping stripes 172 which have corresponding optical cavities 176 that extend between end facets 175 and 177. Stripes 172 extend from end facet 175 to region F. Stripes 172 are sufficiently separated so that weak coupling in modal overlap between adjacent laser cavities occurs. Region F is a broad area contact stripe 174 extending laterally across the laser. Thus each of the stripes 172 are electrically coupled to broad area stripe 174 and regions represented by stripes 172 and 174 will be uniformly pumped. Region 174 provides for cross modal coupling between adjacent laser cavities as enhanced by the current pumping of this region. Laser 170, as was the case for laser 150, does not incorporate the tuning fork concept of other embodiments but is illustrated for the purpose of discussion below involving the interchange and combination of different regions making up a laser structure.

Figure 12:
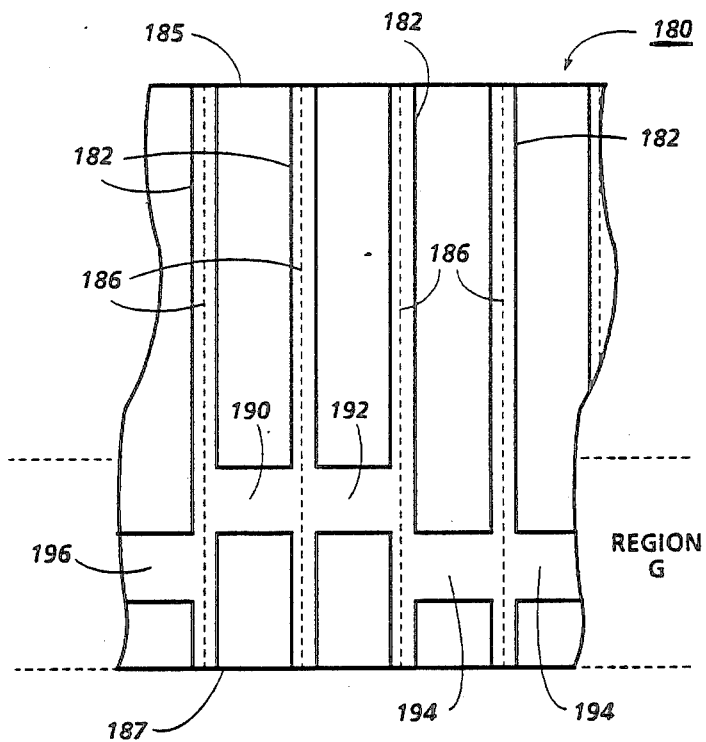

In FIG. 12, semiconductor array laser 180 comprises a series of primary pumping stripes 182 which have corresponding optical cavities 186 that extend between end facets 185 and 187. Stripes 182 are sufficiently separated so that weak coupling in modal overlap between adjacent laser cavities occurs. However, in region G of laser 180, the stripe geometry of cavities 186 is contiguous in the in-between regions 190, 192, 194 and 196 between adjacent laser cavities 186. The modal pattern in cavities 186 can, therefore, extend into adjacent regions 190-196 enhanced by the pumping of these regions. These contiguous regions may be offset as shown in FIG. 12 wherein regions 190 and 192 are offset relative to regions 194 and 196. Again, the tuning fork is not exploited in FIG. 12 but is illustrated for the purposes as previously explained relative to FIG. 11. The purpose of the laser geometry structures of FIGS. 9, 11 and 12, in particular, regions C, F and G, are to improve modal coupling via pumped or unpumped regions in designated areas between adjacent laser cavities.

For the purposes of a phased array laser of this invention, the laser would comprise the structure as shown in FIG. 7. However, one or more regions B, C, D, E, F or G could be combined with the structure of laser 120 along the cavity length. The advantage achieved is improved modal coupling and the establishment of continuous fundamental supermode operation. For example, a laser 120 may consist of offset stripe region A followed by a main pumping region M, followed by a broad pumping region F, followed by another main pumping region M. As a further example, laser 120 may consist of offset stripe region A followed by main pumping region M, followed by broad pumping region F, followed by another main pumping region M and ending with another offset stripe region A. Other examples of sequential regional series are A,D,C,D,A and A,M,C,M,A. For improvement in modal coupling, a laser 120 may comprise one or more regions M in combination with one or more regions B,C,E,F or G. Rather than more than one region M, the main pumping regions of such combination laser structures may include in their combination region M and region D separated by one of the regions B, C, E, F or G.

Although the forgoing embodiments have been described in connection with semiconductors of the GaAs/GaAlAs regime, other light emitting materials may be employed, such as InGaAsP, GaAlP, GaAlSb and PbSnTe.

While the invention has been described in conjunction with a few specific embodiments, it is evident from the above discussion as well as to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A hybrid index/gain guided semiconductor laser comprising a plurality of contiguous semiconductor layers deposited on a substrate, one or more of said layers forming an active region having a lower bandgap and higher index of refraction relative to at least cladding layers immediately adjacent thereto, said active region approximate to a p-n junction when, upon forward biasing via primary current confinement means, permitting carrier recombination in at least one portion thereof and supporting radiation propagation under lasing conditions in an optical cavity established between transverse end facets of the laser beneath said primary current confinement means, said laser having at least two regions of current confinement means, the first of said regions containing said primary current confinement means and comprising a single current confinement stripe and extending from one laser facet toward the second of said regions, said second region having a pair of current confinement stripes parallel but axially offset relative to the axis of said primary current confinement stripe and extending from the other laser facet toward said first region, said axially offset current confinement stripes providing regions of lower refractive index in said laser compared to the region of said optical cavity established therebetween and functioning as an index optical waveguide for said laser.

2. The hybrid index/gain guided semiconductor laser of claim 1 wherein said primary current confinement stripe and said offset current confinement stripes each extend to the junction of said first and second regions.

3. The hybrid index/gain guided semiconductor laser of claim 1 wherein said primary current confinement stripe and said offset current confinement stripes are contiguous at their inner ends.

4. The hybrid index/gain guided semiconductor laser of claim 1 wherein said primary current confinement stripe is an axially aligned series of intermittent current confinement segments.

5. The hybrid index/gain guided semiconductor laser of claim 4 wherein said offset current confinement stripes are an axially aligned series of intermittent current confinement segments adjacent each side of said primary current confinement stripe, said offset segments alternating spatially relative to said primary segments.

6. The hybrid index/gain guided semiconductor laser of claim 1 wherein there is a third region oppositely opposed relative to said second region and having a pair of current confinement stripes parallel but axially offset relative to the axis of said primary current confinement stripe and extending from said one laser facet toward said second region.

7. The hybrid index/gain guided semiconductor laser of any one of claims 1 through 6 wherein V-grooves are formed as part of said axially offset current confinement stripes to provide for sharper current confinement profiles into said lower refractive index regions of said second region.

8. A hybrid index/gain guided semiconductor laser comprising a plurality of contiguous semiconductor layers deposited on a substrate, one or more of said layers forming an active region having a lower bandgap and higher index of refraction relative to at least cladding layers immediately adjacent thereto, said active region approximate to a p-n junction when, upon forward biasing via primary current confinement means, permitting carrier recombination in at least one portion thereof and supporting radiation propagation under lasing conditions in an optical cavity established between transverse end facets of the laser beneath said primary current confinement means, said laser having two regions of current confinement means, the first of said regions containing said primary current confinement means and extending from one laser facet toward the second of said regions, said second region having a pair of current confinement means parallel but axially offset relative to the axis of said primary current confinement means and extending from the other laser facet toward said first region, said axially offset current confinement means providing regions of lower refractive index in said laser compared to the region of said optical cavity established therebetween and functioning as an index optical waveguide for said laser, said first region is electrically isolated from said second region so that said first region is independently pumped relative to said second region, means to change the pumping current to said axially offset current confinement means regions to selectively change the refractive index differences between said axially offset current confinement means regions and said optical cavity region therebetween.

9. A hybrid index/gain guided semiconductor laser comprising a plurality of contiguous semiconductor layers deposited on a substrate, one or more of said layers forming an active region having a lower bandgap and higher index of refraction relative to at least cladding layers immediately adjacent thereto, said active region approximate to a p-n junction when, upon forward biasing via primary current confinement means, permitting carrier recombination in at least one portion thereof and supporting radiation propagation under lasing conditions in an optical cavity established between transverse end facets of the laser beneath said primary current confinement means, said laser having two regions of current confinement means, the first of said regions containing said primary current confinement means and extending from one laser facet toward the second of said regions, said second region having a pair of current confinement means parallel but axially offset relative to the axis of said primary current confinement means and extending from the other laser facet toward said first region, said axially offset current confinement means providing regions of lower refractive index in said laser compared to the region of said optical cavity established therebetween and functioning as an index optical waveguide for said laser, said first region is electrically isolated from said second region and said second region is divided into two electrically isolated regions each including one of said axially offset current confinement means, each of said regions being independently pumped relative to the other of said regions, means to independently change the pumping current to said axially offset current confinement means in said isolated regions to selectively change the refractive index differences therebetween to control the angularity of emission of a beam from said optical cavity.

10. A hybrid index/gain guided semiconductor laser comprising a plurality of contiguous semiconductor layers deposited on a substrate, one or more of said layers forming an active region having a lower bandgap and higher index of refraction relative to at least cladding layers immediately adjacent thereto, said active region approximate to a p-n junction when, upon forward biasing via primary current confinement means, permitting carrier recombination in at least one portion thereof and supporting radiation propagation under lasing conditions in an optical cavity established between transverse end facets of the laser beneath said primary current confinement means, said laser having two regions of current confinement means, the first of said regions containing said primary current confinement means and extending from one laser facets toward the second of said regions, said second region having a pair of current confinement means parallel but axially offset relative to the axis of said primary current confinement means and extending from the other laser facet toward said first region, said axially offset current confinement means providing regions of lower refractive index in said laser compared to the region of said optical cavity established therebetween and functioning as an index optical waveguide for said laser, said axially offset current confinement means tapered at their inner end.

11. The hybrid index/gain guided semiconductor laser of claim 10 wherein said primary current confinement means tapered at their inner end.

12. A hybrid index/gain guided semiconductor laser comprising a plurality of contiguous semiconductor layers deposited on a substrate, one or more of said layers forming an active region having a lower bandgap and higher index of refraction relative to at least cladding layers immediately adjacent thereto, said active region approximate to a p-n junction when, upon forward biasing via primary current confinement means, permitting carrier recombination in at least one portion thereof and supporting radiation propagation under lasing conditions in an optical cavity established between transverse end facets of the laser beneath said primary current confinement means, said laser having two regions of current confinement means, the first of said regions containing said primary current confinement means and extending from one laser facet toward the second of said regions, said second region having a pair of current confinement means parallel but axially offset relative to the axis of said primary current confinement means and extending from the other laser facet toward said first region, said axially offset current confinement means providing regions of lower refractive index in said laser compared to the region of said optical cavity established therebetween and functioning as an index optical waveguide for said laser, said axially offset current confinement means tapered at both ends.

13. The hybrid index/gain guided semiconductor laser of claim 12 wherein primary current confinement means tapered at their inner end.

14. The hybrid index/gain guided semiconductor laser of any one of claims 8 through 13 wherein V-grooves are formed as part of said axially offset current confinement means to provide for sharper current confinement profiles into said lower refractive index regions of said second region.

15. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, said first region is electrically isolated from said second region so that said first region is independently pumped relative to said second region.

16. The hybrid index/gain guided semiconductor array laser of claim 15 which includes means to varying the pumping current to said axially offset current confinement means regions to selectively change the refractive index differences between said axially offset current confinement means regions and said optical cavity region therebetween.

17. The hybrid index/gain guided semiconductor array laser of claim 15 wherein said primary current confinement means and said offset current confinement means each extend to the junction of said first and second regions.

18. The hybrid index/gain guided semiconductor array laser of claim 15 wherein said primary current confinement means extend to said second region and said offset current confinement means extend to said first region.

19. The hybrid index/gain guided semiconductor laser of claim 15 wherein there is a third region oppositely opposed relative to said second region and having a plurality of current confinement means parallel but axially offset relative to the axis of said primary current confinement means and extending from said one laser facet toward said second region.

20. The array gain guided semiconductor laser of claim 15 wherein said lasing elements are sufficiently close to each other so that the optical field of each lasing element is coupled into the optical cavities of adjacent lasing elements to provide a phased locked condition across said array laser.

21. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, said primary current confinement means include secondary current confinement means in said second region in axial alignment with said first primary current confinement means and extend from said other laser facet positioned midway within said second region.

22. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, said offset current confinement means are positioned between the ends of said primary and secondary current confinement means but axially offset relative thereto.

23. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, alternate of said primary current confinement means extending from said one laser facet into said second region.

24. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means. the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, a second set of said offset current confinement means are provided between said primary current confinement means and are in axial alignment with said offset current confinement means in said second region.

25. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, a third region included in said array laser and contiguous with at least one of said regions, said third region devoid of said current confinement means.

26. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending form one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, a third region included in said array laser and contiguous with at least one of said regions, said primary current confinement means extending through said third region.

27. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, said first region is electrically isolated from said second region and said second region is divided into alternate electrically isolated regions each including one of said axially offset current confinement means, alternate of said isolated regions being independently pumped relative to the other alternate of said isolated regions.

28. The hybrid index/gain guided semiconductor laser of claim 27 means to independently change the pumping current to said axially offset current confinement means in said alternate isolated regions to selectively change the refractive index differences therebetween to control the angularity of emission of a beam from said optical cavity.

29. An hybrid index/gain guided semiconductor array laser comprising a plurality of contiguous semiconductor layers deposited on a substrate, one or more of said layers forming an active region having a lower bandgap and higher index of refraction relative to at least cladding layers immediately adjacent thereto, a plurality of spatially disposed multiple lasing elements formed relative to said active region providing optical cavities for light wave generation and propagation under lasing conditions, said active region approximate to a p-n junction when, upon forward biasing via primary current confinement means, permitting carrier recombination in at least one portion thereof and supporting radiation propagation under lasing conditions in each of said optical cavities established between transverse end facets of the laser beneath said primary current confinement means, said laser having two regions of current confinement means, the first of said regions containing said primary current confinement means and extending from one laser facet toward the second of said regions, said second region having a plurality of current confinement means parallel but axially offset relative to the axis of said primary current confinement means and extending from the other laser facet toward said first region, said axially offset current confinement means providing regions of lower refractive index in said laser compared to the regions of said optical cavities established therebetween and functioning as an index optical waveguides for said lasing elements of said array laser, said axially offset current confinement means tapered at their inner ends.

30. The hybrid index/gain guided semiconductor laser of claim 29 wherein said primary current confinement means tapered at their inner end.

31. The hybrid index/gain guided semiconductor laser of anv one of claims 15 through 30 wherein V-grooves are formed as part of said axially offset current confinement means to provide for sharper current confinement profiles into said lower refractive index regions of said second region.

* * * * *